United States Patent [19]

Igarashi

[11] Patent Number: 4,742,431
[45] Date of Patent: May 3, 1988

[54] FLEXIBLE CIRCUIT BOARD
[75] Inventor: Yutaka Igarashi, Oume, Japan
[73] Assignee: Kabushiki Kaisha Toshiba, Kawasaki, Japan
[21] Appl. No.: 864,836
[22] Filed: May 20, 1986

Related U.S. Application Data

[62] Division of Ser. No. 644,970, Aug. 28, 1984, abandoned.

[30] Foreign Application Priority Data

Aug. 31, 1983 [JP] Japan .................. 58-160121

[51] Int. Cl.⁴ .............................................. H05K 1/02
[52] U.S. Cl. .............................. 361/398; 174/52 FP; 361/401; 357/70
[58] Field of Search ................ 361/398, 401; 174/52 FP; 357/70

[56] References Cited

U.S. PATENT DOCUMENTS

| | | | |
|---|---|---|---|
| 3,179,913 | 4/1965 | Mittler et al. | 174/68.5 X |
| 3,968,563 | 7/1976 | Hamlin | 357/70 X |
| 4,049,903 | 9/1977 | Kobler | 357/70 X |
| 4,234,666 | 11/1980 | Gursky | 361/421 X |
| 4,316,320 | 2/1982 | Nogawa et al. | 174/52 FP |
| 4,343,083 | 8/1982 | Takemura et al. | 29/847 |
| 4,621,278 | 11/1986 | Miura | 357/70 |

OTHER PUBLICATIONS

Hugle Industries, IC Ribbons, Electronics, V. 40, #15, Jul. 24, 1967, printed by McGraw-Hill, N.Y., N.Y., pp. 36 & 37.
Circuit-Stik Inc., catalog #501, Gardenia, CA, 1970, 16 pages.

Primary Examiner—R. R. Kucia
Attorney, Agent, or Firm—Schwartz, Jeffery, Schwaab, Mack, Blumenthal & Evans

[57] ABSTRACT

A printed wiring board comprising a main printed wiring board provided with a first wiring pattern, and an auxiliary flexible printed wiring board, provided with a second wiring pattern for modifying the first wiring pattern and bonded to the main printed wiring board so as to electrically connect the second wiring pattern to a desired part of the first wiring pattern. The auxiliary board may be affixed to the main board with a pressure-sensitive adhesive or thermosetting adhesive. The auxiliary board may be provided with marks for facilitating alignment, holes to provide access to the main board, a dummy pattern for preventing tears of the flexible auxiliary board, and a second dummy pattern to prevent warping from uneven stresses applied to the flexible auxiliary board by differences in thermal expansion of the auxiliary board and the pattern printed thereon. A method of making the board is also disclosed and claimed.

4 Claims, 4 Drawing Sheets

FLEXIBLE CIRCUIT BOARD

This is a division of application Ser. No. 644,970, filed Aug. 28, 1984, now abandoned.

BACKGROUND OF THE INVENTION

The present invention relates to a printed wiring board, and more particularly to a printed wiring board comprising a main printed wiring board of a single-layer or of multi layers, having a wiring pattern of a circuit for performing a desired function and a flexible auxiliary printed wiring board having a wiring pattern for effectively modifying the pattern on the main printed wiring board, and to a method for producing a printed circuit board comprising the above-described printed wiring board and electronic component parts mounted thereon.

A wiring pattern of a printed wiring board (hereinafter referred to as a PW board) is designed and formed to serve a specific function, intended use or the like of the PW board. It sometimes occurs that need for reconstruction arises because of mistake in designing or design is modified. To cope with such a situation, jumper wiring is adopted.

An example of conventional jumper wiring is shown in FIGS. 1 and 2. As illustrated, a wiring pattern and lands 5 are formed on the bottom surface of a substrate 1, and leads 3' of various component parts are made to penetrate through through-holes of the respective lands 6 and are soldered by solder 4 to the wiring pattern 5 and the lands 6. Jumper wires 2 are soldered to connect the lands 6 which are required to be connected together to modify the circuit. Such direct connection by jumper wires between the required points, different from the connection by the wiring pattern on the substrate 1 is called jumper wiring.

The above-described jumper wiring has the following problems. That is, the conventional jumper wiring is conducted manually, one by one, for individual PW boards, and for that purpose wires have to be cut to the suitable length and the insulator of the wires has to be removed or peeled. Such work is time consuming and leads to miswiring. Also, jumper wiring requires skill. For these reasons, productivity is lowered.

A solution to this problem is disclosed in Japanese Utility Model Application Publication No. 9592/1969 published on Apr. 18, 1969. The PW board disclosed therein comprises a main PW board having a wiring pattern and through-holes for mounting component parts, and an auxiliary PW board having through-holes in alignment with certain of the through-holes of the main PW board and jumper wiring formed to connect the through-holes, and pins extending through both of the through-holes of the two boards to achieve electrical connection as well as mechanical coupling between the two boards.

Details of such a conventional PW board is shown in FIG. 3(a), FIG. 3(b) and FIG. 3(c), of which FIG. 3(b) shows a cross section along lines IIIb—IIIb in FIG. 3(a), and FIG. 3(c) shows a cross section along lines IIIc—IIIc in FIG. 3(a).

As illustrated, the main PW board is provided with a printed wiring pattern 5 for providing electrical connection between a land 6 having a through-hole for mounting an electronic component part and another land 6 also having a through-hole. An auxiliary PW board 8 is laid on the main PW board 1, and is provided with lands 6' having through-holes in alignment with the through-holes of the lands 6 of the main PW board 1 and a wiring pattern 9 formed to provide connection to serve for the same purpose as the jumper wires 2 of FIGS. 1 and 2.

Pins 17 shown in FIG. 3(c) provide electrical connection and mechanical coupling of the auxiliary PW board 8 to the main PW board 1. After the auxiliary PW board 8 is laid on the main PW board so that the through-holes of the lands 6' of the auxiliary PW board 8 are correctly in alignment with the through-holes of the lands 6 of the main PW board 1, the pins 17 are inserted in the through-holes of both boards 1 and 8 and soldering is conducted to secure the boards to each other.

With this prior art PW board, manual wiring of the jumper wire 2 of FIGS. 1 and 2 is no longer necessary, but an auxiliary PW board 8 with the required wiring pattern is joined to the main PW board by means of pins and solder, with the result that ommission of or error in jumper wiring can be prevented and the work for jumper wiring is much simplified.

But the above-described PW board has the following disadvantages. First, joining the auxiliary PW board to the main PW board by means of pins and solder requires much work and time and hence increases the manufacturing cost.

Secondly, the thickness of the auxiliary PW board, which is about the same as that of the main PW board makes it difficult to conduct a test after the electronic component parts are mounted and soldered. That is the lead pins of the electronic parts which are made to penetrate through the through-holes of the two boards are not exposed on the bottom side, because of the thickness of the auxiliary PW board, so that a test, such as conduction test is difficult.

In addition, when it is desired to alter, e.g., cut, the wiring pattern of the main PW board after the auxiliary PW board is joined, it is necessary to remove the auxiliary PW board, with the work of the removal involving removal of the pins and the solder. Such work is also time consuming.

SUMMARY OF THE INVENTION

An object of the invention is to provide a PW board having a main PW board and an auxiliary PW board constituted by a flexible board having a jumper wiring pattern, and thereby to enable improvement of the productivity of the PW board.

Another object of the invention is to enable production of a simplified multi-layer PW board with a flexible board on which a required wiring pattern is formed and which is joined to the main PW board and thereby to restrict increase of manufacturing cost due to increase of the number of the layers forming the PW board and time length required for designing a PW board.

To attain the above-objects, the invention provides a PW board comprising a main PW board having a first wiring pattern and an auxiliary, flexible PW board having a second wiring pattern for modifying the first wiring pattern, with the auxiliary PW board being bonded to the main PW board so as to provide electrical connection between the second wiring pattern and corresponding parts of the first wiring pattern.

DETAILED DESCRIPTION OF THE PREFERRED EMBODIMENTS

Figure 4:
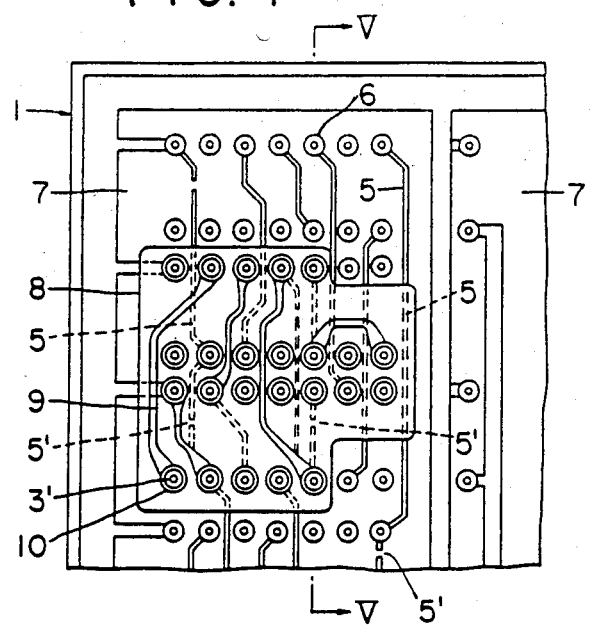
FIG. 4 is a bottom view showing in an enlarged scale a PW board of an embodiment of the invention.
Figure 5:
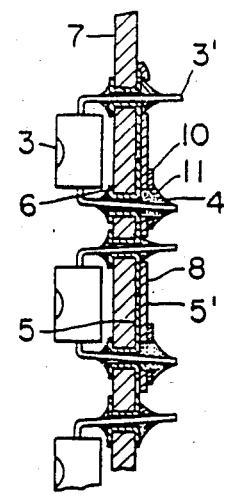
FIG. 5 is a sectional view along line V—V in FIG. 4.

FIGS. 4 and 5 show an embodiment of the invention. As illustrated, a wiring pattern 5 and lands 6 are formed on the bottom surface (lower or rear side) of a main PW board 7, and leads 3' of various component parts 3 mounted on the top surface (upper or front side) are inserted or made to penetrate through the through-holes of the lands 6 and are soldered to the wiring pattern 5 or the lands 6 by solder 4. An auxiliary PW board 8 is mounted or fixed to the desired portion of the main PW board 7, e.g., the portion where jumper wiring is to be made.

Figure 1:
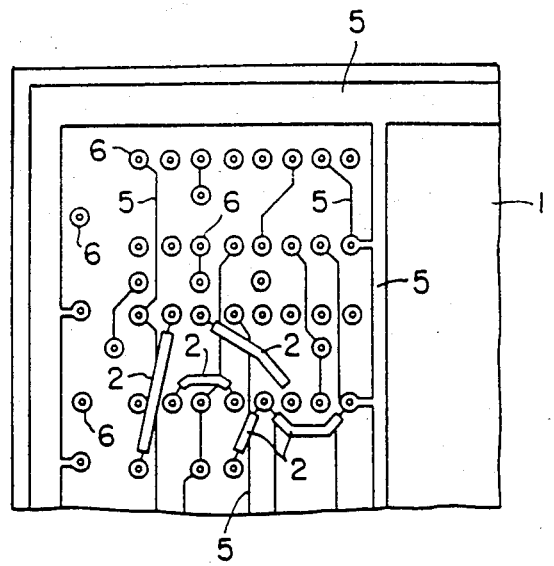
FIG. 1 is a bottom view showing, in an enlarged scale, a PW board with conventional jumper wiring.
Figure 2:
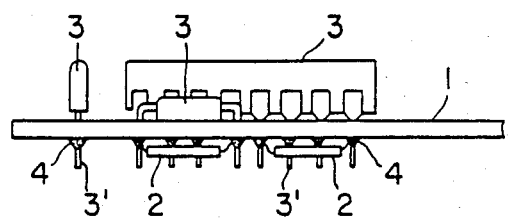
FIG. 2 is an end on view of the PW board shown in FIG. 1.
Figure 3A:
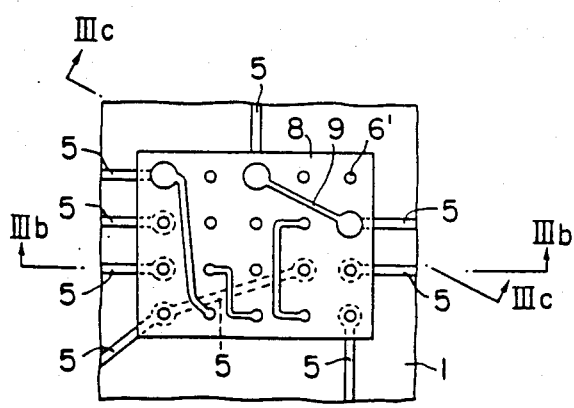
FIG. 3(a) is a bottom view showing, in an enlarged scale, a conventional PW board in which a rigid auxiliary PW board with a wiring pattern corresponding to the jumper wires is mounted to a main PW board by means of pins and solder.
Figure 3B:
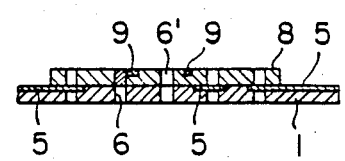
FIG. 3(b) is a sectional view along line IIIb—IIIb in FIG. 3(a)
Figure 3C:
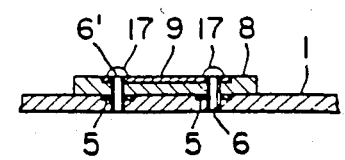
FIG. 3(c) is a sectional view along line IIIc—IIIc in FIG. 3(a)
Figure 7:
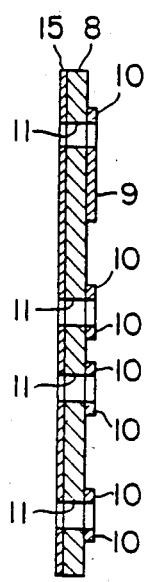
FIG. 7 is a sectional view in a more enlarged scale along line VII—VII in FIG. 6.
Figure 6:
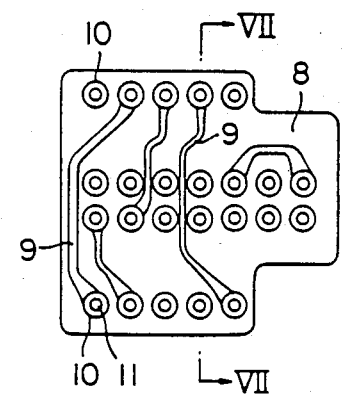
FIG. 6 is a bottom view showing in an enlarged scale of an auxiliary PW board shown in FIGS. 4 and 5.

The auxiliary PW board 8 is formed of a flexible board or sheet made of a material such as polyimid, polyester or the like and, as better illustrated in FIGS. 6 and 7, the auxiliary PW board 8 is provided with a wiring pattern 9 and lands 10 to provide the same electrical connection as the jumper wires 2 shown in FIGS. 1 and 2. A through-hole 11 is formed in each land 10. Moreover, a two-sided pressure-sensitive (tacky adhesive) sheet 15, having an adhesive character on both sides or surfaces, is attached to one side of the auxiliary PW board 8, with the lower side of the sheet 15 being bonded to the upper side of the auxiliary PW board 8.

The auxiliary PW board 8 is produced in the following manner. First, a desired pattern of wiring 9 and lands 10 is formed on a flexible base material or substrate by means of known techniques such as etching. An adhesive sheet 15 is then attached to the flexible substrate 8. Finally, through-holes 11 are formed at the centers of the lands to penetrate through the flexible substrate 8 and the adhesive sheet 15 to produce a flexible PW board 8.

The mounting of the auxiliary PW board 8 onto the main PW board 7 is achieved by bringing the auxiliary PW board 8 into engagement with the main PW board 7 in such a manner that the adhesive sheet 15 is interposed between the two boards 7 and 8, and that the through-holes 11 of the auxiliary PW board 8 are in alignment with the corresponding through-holes of the lands 6 of the main PW board 7 and applying a pressure on the auxiliary PW board 8 thereby bonding the auxiliary PW board 8 to the main PW board 7.

Figure 9A:
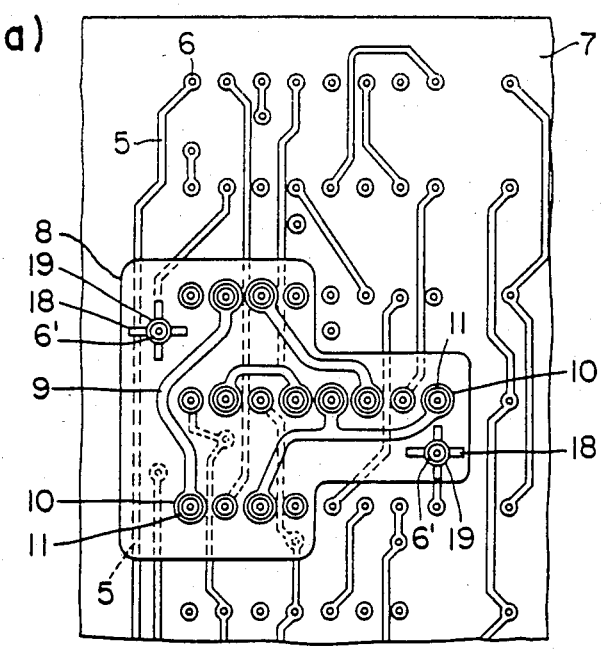
FIG. 9(a) is a bottom view showing in an enlarged scale another embodiment of the invention.
Figure 9B:
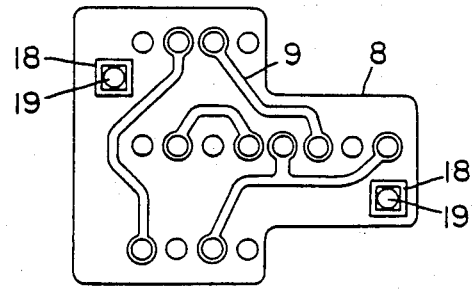
FIG. 9(b) and 9(c) are bottom views showing in an enlarged scale modifications of the auxiliary PW board shown in FIG. 9(a)
Figure 9C:
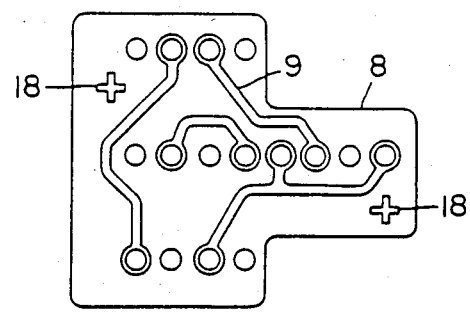

The alignment is facilitated if one or more positioning marks 18 as shown in FIGS. 9(a), 9(b) and 9(c) are provided on the auxiliary PW board 8. In the example of FIG. 9(a), positioning patterns 18 in the form of a cross are formed on the auxiliary PW board 8 at positions corresponding to two selected lands 6' selected from the lands 6 in that region of the main PW board 7 which is covered by the auxiliary PW board 8. A perforation 19 is provided at the center of each cross pattern 18 to enable visual observation or confirmation of the land 6' through the perforation 19. Correct positioning is ensured by aligning the perforations 19 at the centers of the cross patterns 18 with the corresponding lands 6' when bonding the auxiliary PW board 8 to the main PW board 7.

In the example of FIG. 9(b), rectangular patterns 18 are formed in place of the cross patterns.

The example of FIG. 9(c) is usable where the auxiliary PW board 8 has a sufficient degree of transparency to permit the lands 6 or the through-holes in the lands, or the patterns 5 to be observed through the auxiliary PW board 8. In this example, the perforations 19 are not provided but only the cross patterns 18 are formed. During the bonding, the centers of the cross patterns 18 are aligned with the corresponding lands 6'. The positioning patterns may alternatively be superimposed on and aligned with part of the wiring patterns 5 formed on the main PW board.

In each of the examples shown in FIGS. 9(a), 9(b) and 9(c), the positioning patterns 18 may be formed of the same material (e.g., copper foil) as the jumper wiring pattern 9, or of a paint. Choosing the same material as the jumper wiring pattern 9 is advantageous in that the positioning patterns 18 can be formed simultaneously with the wiring pattern 9, and no additional production step is required.

The use of the adhesive sheet 15 for bonding the auxiliary PW board 8 to the main PW board 7 is advantageous in that the auxiliary PW board 8 can be readily peeled or removed when need for removal arises, such as when the auxiliary PW board 8 is bonded at an incorrect position or when it is necessary to alter the jumper wiring formed on the auxiliary PW board 8.

Figure 8:
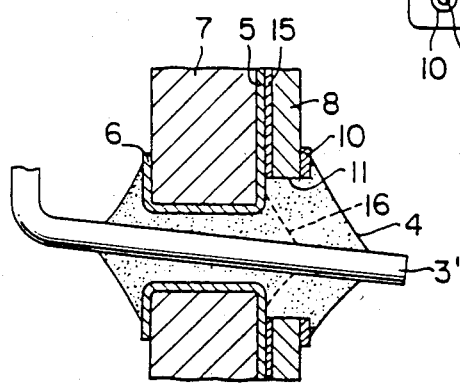
FIG. 8 is a sectional view showing in a still more enlarged scale part of the PW board of FIGS. 4 and 5.

Electrical connection between the auxiliary PW board 8 and the main PW board 7 is accomplished by having, after the auxiliary PW board 8 is bonded to the main PW board 7, the leads 3' of the electronic component parts 3 penetrate through the through-holes 11 of the lands 10 of the auxiliary PW board 8, as well as the through-holes of the main PW board 7, as shown in FIG. 8, and bringing that side of the auxiliary PW board 8 which is opposite to that bonded to the main PW board 7 into contact with molten solder to effect soldering. If the through-holes 11 of the auxiliary PW board 8 are made to be a little larger than the through-holes of the lands 6, the molten solder will flow through the through-holes 11 and reach the lands 6 when the auxiliary PW board 8 bonded to the main PW board 7 is brought into contact with the molten solder.

Mounting the electronic parts 3 can be conducted by the use of an automatic part inserting device (an IC insertor) since the auxiliary PW board 8 is formed of a flexible substrate and is hence thin, and accordingly the added or bonded auxiliary PW board 8 does not produce any considerable adverse effect on the use of the automatic part inserting device.

Soldering can also be conducted by means of automatic soldering provided that the flexible substrate 8 and the adhesive sheet 15 are made of heat resistant materials.

As an alternative to the pressure sensitive adhesive sheet 15, an adhesive material such as a thermo-setting synthetic resin may be interposed betwen the auxiliary PW board 8 and the main PW board 7, and a heat press may be applied on that side of the auxiliary PW board 8 which is opposite to that facing the main PW board 7 to effect adhesion between the two boards 7 and 8. In this case, the auxiliary PW board 8 is produced in the following manner. First, a desired pattern of wiring 9 and lands 10 are fomed on a flexible substrate by means of etching and the like. Next, an adhesive material 15 such as a thermosetting resin is applied on the flexible substrate 8. Finally, through-holes 11 are formed at the centers of the lands 10 to penetrate through the flexible substrate 8 and the adhesive material layer to produce a flexible PW board 8.

It has been described that the electronic component parts 3 are mounted after the auxiliary PW board 8 is bonded to the main PW board 7. But the auxiliary PW board 8 may be bonded to the main PW board 7 after the electronic component parts 3 are mounted and soldered to the main PW board 7. More praticularly, the leads 3' may first be inserted in and soldered to the lands 6 of the main PW board, and the auxiliary PW board 8 is thereafter superimposed on the main PW board 7 in such a manner that the leads 3' are inserted in the lands 10, and the leads 3' an soldered to the lands 10. The through-holes 11 of the auxiliary PW board should preferably be a little larger to avoid the fillet 16 (indicated by a broken line in FIG. 8) of the solder produced as a result of soldering of the leads 3' to the main PW board 7.

The lands 10 of the auxiliary PW board may be so formed as to have exposed portions on both sides, and the wall of the through-holes 11 may also be copper clad. This will facilitate flow of the solder and ensure firm electrical connection and fixing of the auxiliary PW board 7.

In the above-described cases, the auxiliary PW board 8 is fixed to the main PW board 7 by means of soldering. The use of an adhesive for bonding can therefore be omitted. But if the two boards 7 and 8 are bonded by an adhesive in advance, the soldering is facilitated, so that use of an adhesive for bonding is preferrable.

Where the electronic parts 3 are mounted to the main PW board 7 by the use of an automatic part inserting device the leads 3' are generally a little bent in the predetermined directions to prevent coming-off of the leads 3'. If the through-holes 11 are circular, mounting the auxiliary PW board 8 to the main PW board 7 having the electronic parts 3 already mounted thereto may be difficult because of the bent leads 3'. In such a case, it is preferrable that the through-holes 11 be elongated in the direction of the bent to facilitate the mounting of the auxiliary PW board 8.

Figure 10:
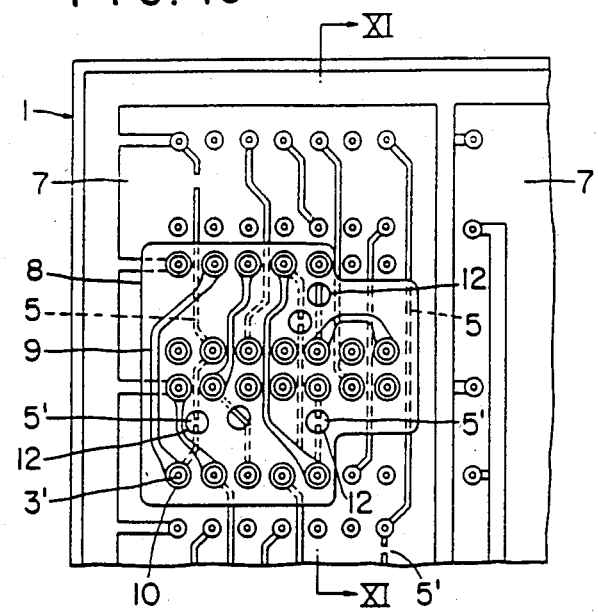
FIG. 10 is a bottom view showing in an enlarged scale a further embodiment of the invention.
Figure 11:
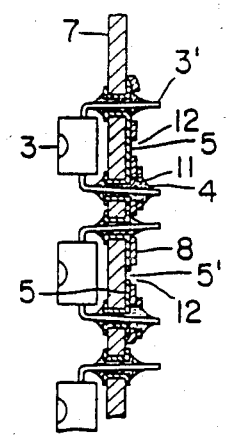
FIG. 11 is a sectional view along line XI—XI in FIG. 10.

FIGS. 10 and 11 show another embodiment of the invention, which is generally identical to the embodiment of FIGS. 4 and 5. The difference is that the auxiliary PW board 8 is provided with perforations 12 at various positions corresponding to the positions at which the wiring pattern 5 is cut and/or at positions at which there is a certain degree of possibility that such cutting becomes necessary because of design modification or the like.

The perforations 12 enables visual observation of the wiring pattern 5 to ascertain whether the wiring pattern is actually cut, and thereby enabling easy and quick inspection. Moreover, when the need arises for cutting of that portion of the wiring pattern 5 which lies under the auxiliary PW board 8, a cutter may be inserted through the perforation 12 and the wiring pattern 5 may be cut. This obviates the necessity of removing the auxiliary PW board 8 for the cutting.

Instead of providing perforations 12, the auxiliary PW board 8 may be formed of a material having a certain degree of transparency (i.e., perfectly transparent or semi-transparent) to enable visual observation of the wiring pattern 5 on the main PW board 7. In this case, by forming the auxiliary PW board 8 of a material which is easy to cut, the wiring pattern 5 as well as that part of the auxiliary PW board 8 covering the wiring pattern 5 can be cut and removed. In this case too, the auxiliary PW board 8 need not be peeled for the cutting.

Where a wiring pattern or lands are formed on that side of the auxiliary PW board 8 which faces tha main PW board 7, insulating means may be employed, e.g., an insulating layer may be formed to cover such wiring pattern or lands to prevent their contact with the wiring pattern on the main PW board 7.

Where the wiring patterns are formed on both sides of the auxiliary PW board 8, the wiring density (amount of wiring per unit area) of the auxiliary PW board 8 is increased. Moreover, when a copper foil or layer is formed on the wall surfaces of the through-holes 11 of the auxiliary PW board 8, the flow of solder through the through-holes 11 is facilitated and it will be less likely that any failure should occur in electrical connection between the lands 6 and 10.

Since the auxiliary PW board 8 is formed of a thin, flexible PW board, the work for mounting the auxiliary PW board 8 to the main PW board 7 is much improved since the auxiliary PW board 8 can for example be easily stuck. Moreover, the length of the projection of the bottom surface of the auxiliary PW board 8 from the bottom surface of the main PW board 7 is reduced, so that soldering, circuit testing conducted by having a contactor in engagement with the lands, and the like are facilitated. Furthermore, the cutting of the wiring pattern 5 is further facilitated.

Figure 12A:
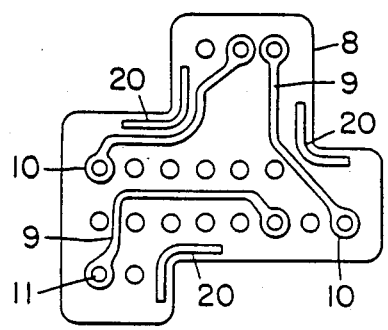
FIGS. 12(a), 12(b) and 12(c) are bottom views showing in an enlarged scale of variations of the wiring pattern of the auxiliary PW board.
Figure 12B:
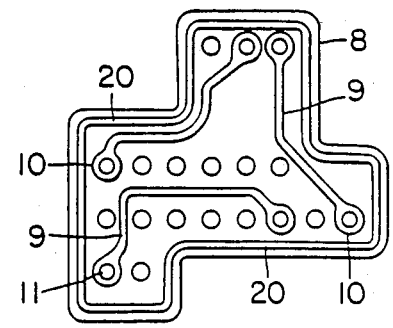
Figure 12C:
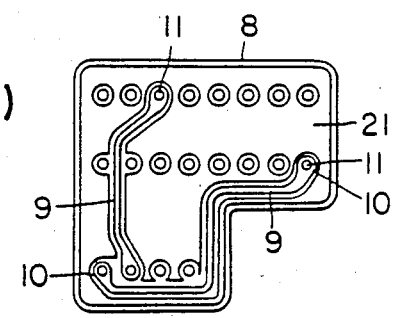

A problem associated with the use of a flexible substrate for the auxiliary PW board 8 is that it is relatively easy for the auxiliary PW board to tear or break, particularly at a position where the edge is inwardly curved. To solve this problem, a reinforcement dummy pattern 20 may be formed to extend along the edge, or periphery as shown in FIG. 12(*a*), and FIG. 12(*b*). In the example of FIG. 12(*a*), the dummy pattern 20 is formed to cover only the inwardly curved edge portions where a tear is most likely to occur. In the example of FIG. 12(*b*), the dummy pattern 20 is formed to extend all along the entire periphery. By providing the dummy pattern 20, any tear developing from the edge of the auxiliary PW board is prevented from further developing or penetrating into the area inside of the dummy pattern 20. In either case, the dummy pattern 20 is formed of the same material as the wiring pattern 9 to facilitate the production of the auxiliary PW board.

Another problem associated with the use of a flexible PW board 8, is that warp or twist may occur when the wiring pattern 9 is not uniformly distributed over the surface of the PW board 8. This is due to the difference in thermal expansion coefficient between the conductor (e.g., copper) forming the wiring pattern and the substrate material (e.g., polyimid) of the auxiliary PW board 8, when warp or twist occurs in the auxiliary PW board 8, intimate contact between the main and the auxiliary PW boards 7 and 8 cannot be achieved, which lowers the efficiency of work on the boards and may cause failures or errors in the wiring. To solve this problem, an additional dummy pattern 21 for preventing warp of twist may be formed to cover the entire blank area where the wiring pattern 9 required to provide the electrical circuit function is not formed. The dummy pattern 21 is not electrically connected to the wiring pattern 9, and is formed of the same material as the wiring pattern 9. The provision of the dummy pattern 21 will result in a better uniformity as regards the thermal expansion coefficient throughout the entire surface of the board 8, and prevent warp and twist. The dummy pattern 21, which in the embodiment described above, is formed to cover the entire blank area where the wiring pattern 9 is not formed, may alternatively be formed to cover part only of the blank area where the wiring pattern 9 is not formed, in such a manner that the aggregation of the wiring pattern 9 and the dummy pattern 21 is distributed evenly throughout the auxiliary PW board 8.

The various problems discussed above are encountered wherever a flexible board is used so that their solution can be applied to any electrical circuit device with a flexible board.

The application of the auxiliary PW board is not limited to a situation when the wiring pattern formed on the auxiliary PW board is a jumper wiring pattern. For instance, where it is not necessary to add a whole wiring layer but is necessary to add part only of a wiring layer to meet the demand for increase in the amount of wiring, an auxiliary PW board as described above may be mounted to the main PW board. The cost for adding a whole wiring layer is about the same as the cost of a single-layer PW board. Substituting an auxiliary PW board as described above will substantially reduce the cost.

As has been described, according to the invention, a wiring pattern such as a jumper wiring pattern is formed on an auxiliary PW board constituted by a flexible substrate, and the auxiliary PW board is mounted to the main PW board by means of adhesive or soldering. The efficiency of the work for wiring, such as jumper wiring, is therefore much improved. Moreover, because the auxiliary PW board is thin, its projection from the bottom surface of the main PW board is small, so that automatic processing made on the bottom side of the PW board such as soldering and testing is in no way obstructed. In addition, it is ensured that the ends of the leads of the electronic component parts which penetrate through the auxiliary PW board are exposed on the bottom side of the auxiliary PW board, so that circuit tests which are conducted by having a contactor contacted with the lands are facilitated. Furthermore, by providing that the part or parts of the wiring pattern on the main PW board be visible through the auxiliary PW board after its mounting, confirmation of the state of the wiring pattern on the main PW board and its cutting are facilitated.

What is claimed is:

1. A flexible circuit board including:
   a flexible nonconductive substrate;
   conductive circuit traces partially distributed on at least one surface of said substrate for composing electrical circuits in cooperation with electrical components to be mounted on said substrate, said circuit traces causing said substrate to warp or twist;
   at least one dummy conductive trace comprised of the same material as said circuit traces and formed on said substrate for filling a region not occupied by said conductive circuit traces without electrical connection to the circuit traces, said dummy conductive traces substantially equalizing a distribution of conductive traces formed on said substrate for preventing the substrate from warping or twisting by said conductive circuit traces;
   said dummy conductive trace and said circuit traces being simultaneously formed on the same surface of said substrate by the same process; and
   said dummy trace not electrically connecting to the circuit traces and the electrical components during operation of said electrical circuits.

2. A flexible circuit board according to claim 1, wherein said dummy trace entirely fills the region not occupied by said circuit traces required to compose said electrical circuits without electrical connection to the circuit traces.

3. In a flexible wiring board which includes a flexible nonconductive substrate and auxiliary conductive traces partially distributed on at least one surface of said substrate thereof causing said flexible substrate to warp or twist, and adapted to adhere to a surface of a main circuit board including a nonconductive substrate and conductive circuit traces for composing electrical circuits in cooperation with electrical components mounted on the substrate of the main circuit board so that the auxiliary conductive traces are electrically connected to the electrical circuits on said main circuit board to modify the electrical circuits, an improvement comprising:
   at least one dummy conductive trace comprised of the same material as said auxiliary conductive traces for filling a remaining area of the surface of the flexible substrate where the auxiliary conductive traces are not distributed without connection to the auxiliary conductive traces, said dummy trace substantially equalizing a distribution of conductive traces formed on said flexible substrate for preventing the flexible wiring board from warping or twisting before it adheres to the main circuit board;
   said dummy trace and said auxiliary conductive traces being simultaneously formed on the same surface of the flexible wiring board by the same process; and
   said dummy trace not electrically connected to the electrical circuits on said main circuit board when said substrate of the flexible wiring board adheres to the surface of the main circuit board and the auxiliary conductive traces are electrically connected to the electrical circuits on the main circuit board.

4. A flexible wiring board according to claim 3, wherein said dummy trace entirely fills the remaining area of the flexible substrate not occupied by the auxiliary conductive traces without electrical connection to the auxiliary conductive traces.

* * * * *